United States Patent

Choi

[19]

[11] Patent Number: 5,930,298
[45] Date of Patent: Jul. 27, 1999

[54] VITERBI DECODER FOR DECODING DEPUNCTURED CODE

[75] Inventor: Young Bae Choi, Seoul, Rep. of Korea

[73] Assignee: Daewoo Electronics Co., Ltd., Seoul, Rep. of Korea

[21] Appl. No.: 08/887,169

[22] Filed: Jul. 1, 1997

[30] Foreign Application Priority Data

Jul. 1, 1996 [KR] Rep. of Korea ...................... 96-26595

[51] Int. Cl.⁶ ...................................... H04L 5/12
[52] U.S. Cl. .......................... 375/262; 375/261; 375/265; 371/43; 371/43.6
[58] Field of Search .................................... 375/262, 265, 375/261, 259; 371/43, 43.6, 30; 348/726

[56] References Cited

U.S. PATENT DOCUMENTS

| 5,418,795 | 5/1995 | Itakura et al. | 371/30 |
| 5,432,803 | 7/1995 | Liu et al. | 371/43.6 |
| 5,509,020 | 4/1996 | Iwajiri et al. | 371/43 |
| 5,548,684 | 8/1996 | Wang et al. | 395/21 |
| 5,717,471 | 2/1998 | Stewart | 348/726 |

FOREIGN PATENT DOCUMENTS

2302779  1/1997  United Kingdom.

*Primary Examiner*—Stephen Chin
*Assistant Examiner*—Shuwang Liu
*Attorney, Agent, or Firm*—Pillsbury Madison & Sutro LLP

[57] ABSTRACT

A Viterbi decoder for decoding depunctured code comprises a branch metric calculation unit; an add/ comparison/ selection unit; a path metric network; a survivor memory unit; a decoding depth control unit; and a decoded symbol selection unit. The decoding depth control unit outputs a decoding depth control signal by determining a decoding depth having the least bit error rate according to code rates of punctured codes. The decoding depth having the least bit error rate is set to a maximum value of integer times or integer+1 times of each code rate's numerators of the punctured codes within a range of a predetermined decoding depth. Accordingly, the Viterbi decoder recovers the original information without the need to expand the conventional survivor memory required for a trace back process in the system using the puncturing technique.

6 Claims, 5 Drawing Sheets

VITERBI DECODER FOR DECODING DEPUNCTURED CODE

BACKGROUND OF THE INVENTION

1. Field of the Invention

The present invention relates to a Viterbi decoder of a digital communication system, and more particularly to a Viterbi decoder for decoding symbol data of various code rates according to puncturing patterns.

2. Description of the Prior Art

In general, a Viterbi algorithm is most widely used as a practical and efficient technique for maximum-likelihood decoding of convolutional codes. The maximum-likelihood decoding is used to determine the shortest path through a topological structure called code trellis.

The Viterbi decoding algorithm uses the trellis structure of code and determines the maximum-likelihood estimate of the sequence to be transmitted that has the largest metric. The Viterbi algorithm simply finds a path, a survivor path, which is defined as the most probable path that has the largest accumulated metric through the trellis, in such a way that it processes the received word in an iterative manner. At each step, it compares the metric of all paths entering each state, stores only the survivor with the largest accumulated metric, and discards the unlikely paths at each state.

FIG. 1 shows a block diagram of a conventional Viterbi decoder. The conventional Viterbi decoder comprises a branch metric calculation unit 11, an add/ comparison/ selection unit 12, a path metric network 13, and a survivor memory unit 14.

The branch metric calculation unit 11 receives symbols from a transmission end and calculates metrics BM at each branch. To find an optimum path of the highest statistical probability, the branch metric becomes a hamming distance for a hard decision decoding, whereas it becomes an Euclidean distance for a soft decision decoding. The add/ comparison/ selection unit 12 processes the candidate paths by adding branch metrics obtained from the branch metric calculation unit 11 to the previous path metrics from the path metric network 13, and selects the shortest path by comparing the candidate path metrics. The shortest path is characterized as the survivor path. A survivor path metric SM is supplied to the path metric network 13, and an information for tracing back the survivor path, that is, a decision vector DV is also supplied to the survivor memory unit 14. The survivor memory unit 14 outputs a final decoded symbol through utilization of the decision vector DV.

FIG. 2 shows a diagram illustrating a trace back algorithm of the survivor memory unit 14 in the conventional Viterbi decoder of FIG. 1. When a convolution encoder having a code rate ½ operates at a shift register of V stages (the number of state is $2^V=N$), the state is represented by contents of the shift register such as $b_{V-1}b_{V-2} \ldots b_1b_0$, indicated in the diagram, in binary digits. Here, the encoded message bits are inputted from the left end of the shift register. As shown in FIG. 2, each state has the decision vectors DV of 1 bit, respectively. The previous state is determined by the decision vector DV of the current state. For example, if the trace back is performed at an arbitrary state "$b_{V-1}b_{V-2} \ldots b_1b_0$" selected from the memory storing the current state Vi, then the previous state Vi-1 becomes "$b_{V-2} \ldots b_1b_00$" by selecting an upper path when the decision vector DV of the state "$b_{V-1}b_{V-2} \ldots b_1b_0$" is "0", whereas the previous state Vi-1 becomes "$b_{V-2} \ldots b_1b_01$" by selecting a lower path when the decision vector DV of the state "$b_{V-1}b_{V-2} \ldots b_1b_0$" is "0". Here, the decision vectors DV of each state is the least significant bit (LSB) of the state corresponding to the survivor path selected in the add/ comparison/ selection unit 12.

Accordingly, since a bit stream of the decision vector DV obtained from the trace back processing corresponds to the right end bit of the shift register of V stages at each encoding cycle, shown in FIG. 2, the bit stream of the decision vector DV corresponds to a message bit inputted in the shift register of the convolution encoder.

FIG. 3 shows a view illustrating a method for determining a decoding depth during the trace back process of the survivor memory unit 14. A survivor path at each state is characterized as a path obtained by trace back from an arbitrary current state to infinity. The survivor path may be the path closest to an encoding path of the encoder. For N states, the optimum process for determining the survivor path finds the closest path among N paths obtained by tracing back of N current states to the infinity.

However, in the Viterbi algorithm, after tracing back to four or five times of constraint length rather than tracing back to the infinity, the result from the trace back in the next is determined as decoded symbol. A progress depth of the trace back is determined as a decoding depth. Additionally, as shown in FIG. 3, since the survivor paths of each state merge into one state during the trace back when the decoding depth of each state is reached, trace back ends at the decoding depth from an arbitrary state.

At this time, it is required that the accurate decoding depth is determined for the convolutional codes of the specific code rates with specific code rates. More particularly, the survivor memory unit 14 processes a trace back algorithm for tracing the previous state corresponding to a decoding depth by using the decision vector DV obtained from the add/ comparison/ selection unit 12. Accordingly, the survivor memory unit 14 requires a memory to store the decision vector DV, as well as number of corresponding decoding depths, and a memory for storing each state.

In digital communication system, the punctured code of high code rate is used to correct error in the channel and increase the efficiency of transmission. In the punctured code, according to special patterns, some symbols has been periodically deleted from output symbols from an encoder having the low code rate so as to obtain a high code rate. Since the punctured code of higher code rate has a characteristic of a high transmission rate, it is widely used in various digital transmission systems.

A punctured convolutional code proposed by Cain, Clark, and Geist in 1979 has been used in the digital communication systems of European or American HDTV and satellite broadcasting services. The European Digital Video Broadcasting system transmits punctured codes with high code rates of ⅔, ¾, ⅚, ⅞, etc. which is obtained according to the puncturing patterns from the code rate ½ in the encoder. Since the codes are depunctured at the receiving end, and the depunctured codes are decoded by the Viterbi decoder, the conventional Viterbi decoder of basic code rate ½ can be used.

However, when the Viterbi decoding is performed by the conventional Viterbi decoder, for the punctured codes (for example, code rates ⅔, ¾, ⅚, ⅞, etc.), the longer decoding depth than for the non-punctured cod (for example, code rate ½) is needed to obtain a low bit error rate. Namely, the decoding depth is determined according to the code rates of the punctured codes, and it increases proportionally by the code rate. In the European Digital Video Broadcasting Standard, since the various punctured convolutional codes (code rates ⅔, ¾, ⅚, ⅞, etc.) are used, it has been known through the simulation that the decoding depth for supporting all of the code rates should be about 96.

Accordingly, since the decoding depth of the Viterbi decoder for decoding depunctured code increases in proportion to the code rate, the survivor memory increases and the processing time is delayed.

SUMMARY OF THE INVENTION

In view of the foregoing, it is an object of the present invention to provide a Viterbi decoder for decoding a depunctured code to extract original bit by determining a decoding depth of the least bit error rate according to code rates of each punctured code word by utilizing the number of memory such as a survivor memory in a basic Viterbi decoder, and selecting and outputting a decoded symbol until a corresponding decoding depth is reached.

In order to achieve the above object, the present invention provides the Viterbi decoder for decoding depunctured codes, comprising:

a survivor memory unit for tracing back a current survivor path to a predetermined decoding depth by using metrics at each branch metric after receiving a decision vector generated from a previous survivor path metric and a symbol depunctured according to puncturing patterns, and outputting a multitude of decoded symbols;

a decoding depth control unit for determining a decoding depth of the least bit error rate according to a code rate of the punctured code, and outputting a decoding depth control signal corresponding to a determined decoding depth; and a decoded symbol selection unit for selecting a symbol traced to the decoding depth corresponding to the decoding depth control signal among a multitude of decoded symbols obtained after tracing back to a predetermined decoding depth in a survivor memory unit, and outputting a final decoded symbol of depunctured code with corresponding code rate.

BRIEF DESCRIPTION OF THE DRAWINGS

The above and other objects, features, and advantages of the present invention will be apparent from the following detailed description of the preferred embodiments of the invention in conjunction with the accompanying drawings, in which.

DESCRIPTION OF THE PREFERRED EMBODIMENT

Reference will now be made in detail to the present invention, examples of which are illustrated in the accompanying drawings. Wherever possible, the same reference numbers will be used throughout the drawings to refer to the same or like parts.

Figure 1:
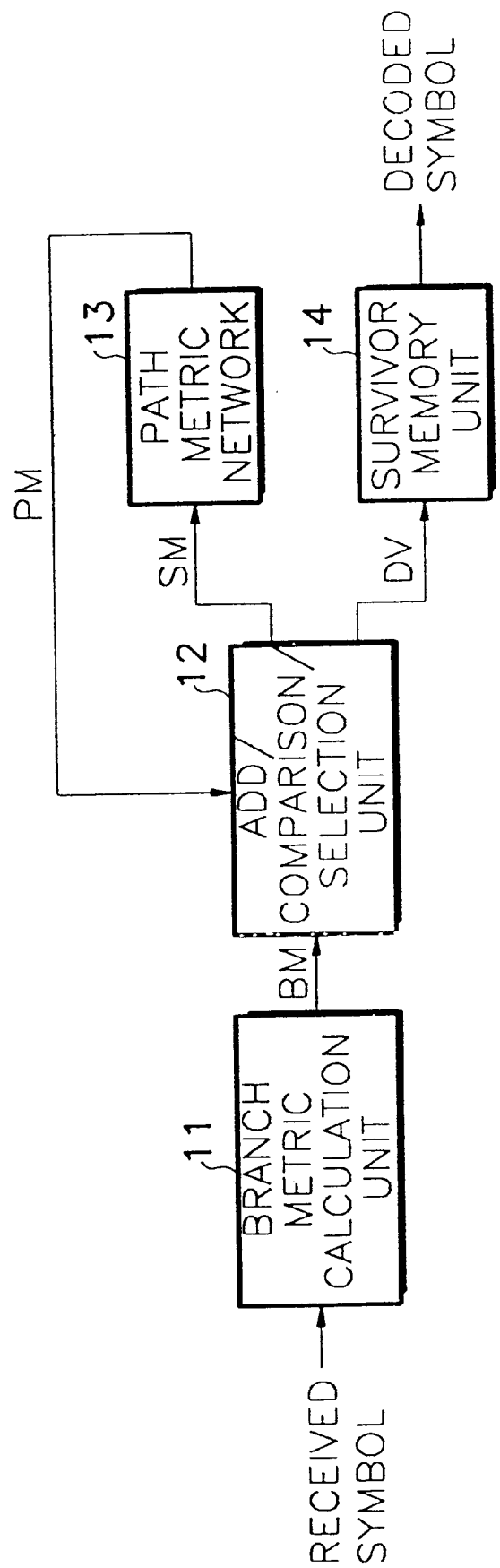
FIG. 1 is a block diagram of a conventional Viterbi decoder.
Figure 2:
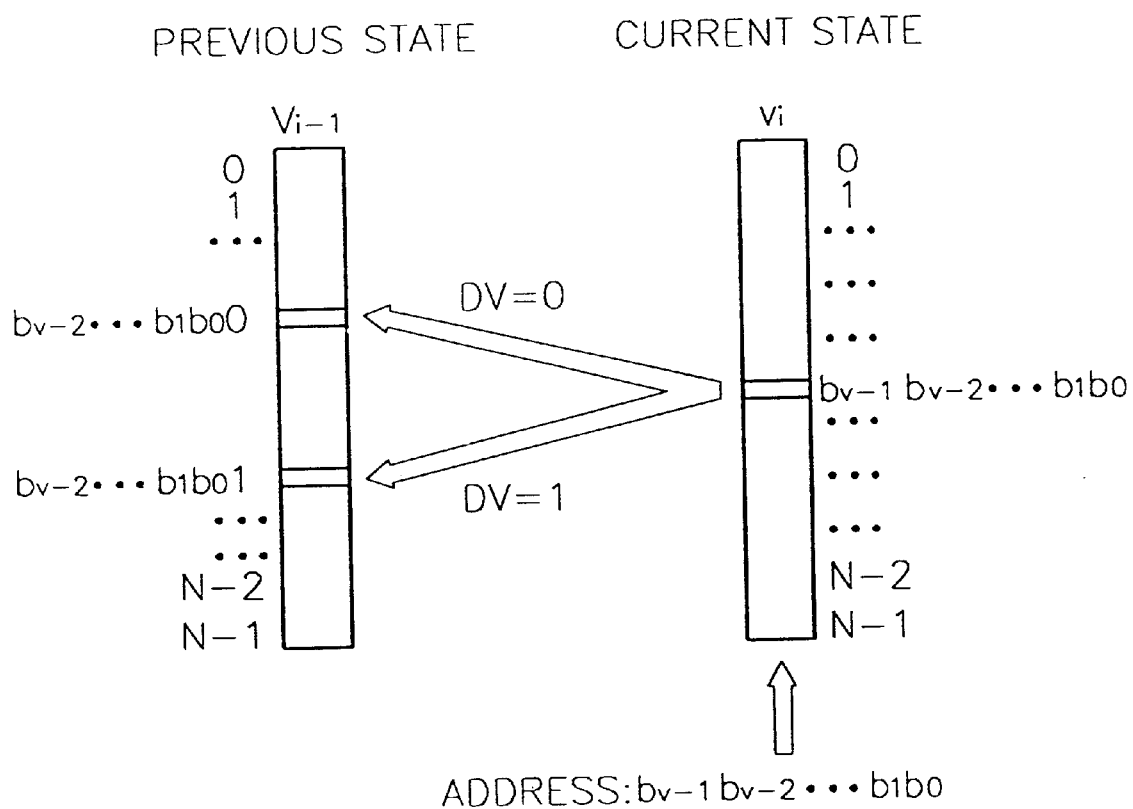
FIG. 2 is a diagram illustrating a trace back algorithm of a survivor memory unit of FIG. 1.
Figure 3:
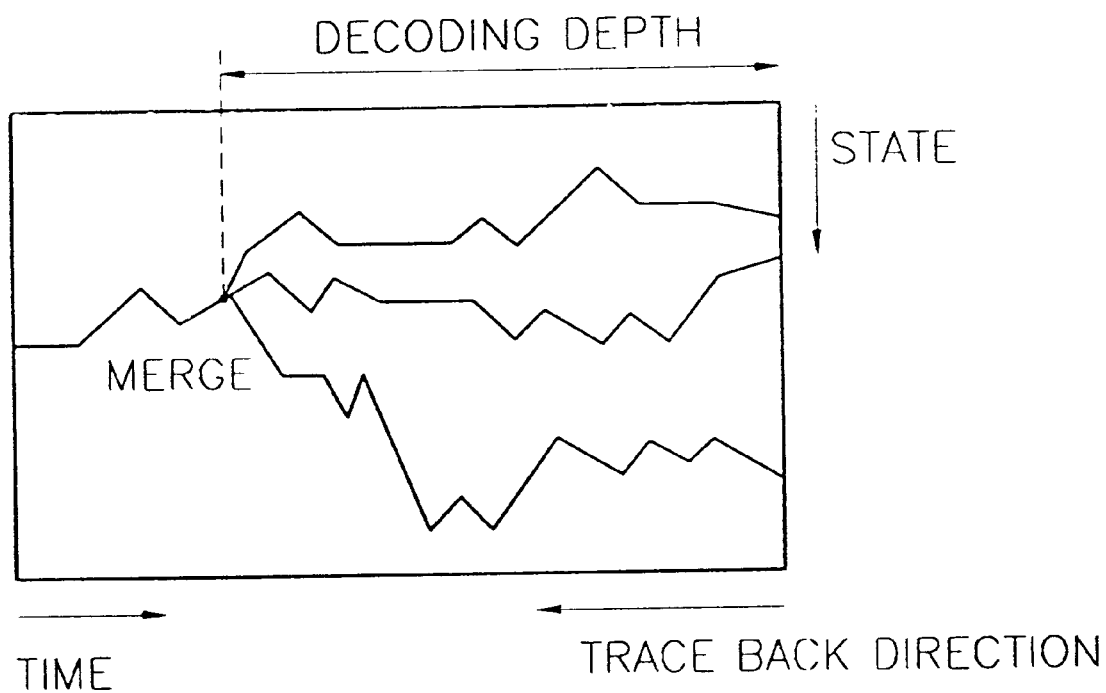
FIG. 3 is a diagram illustrating a trace back of a decoding depth in the survival memory unit of FIG. 1.
Figure 4:
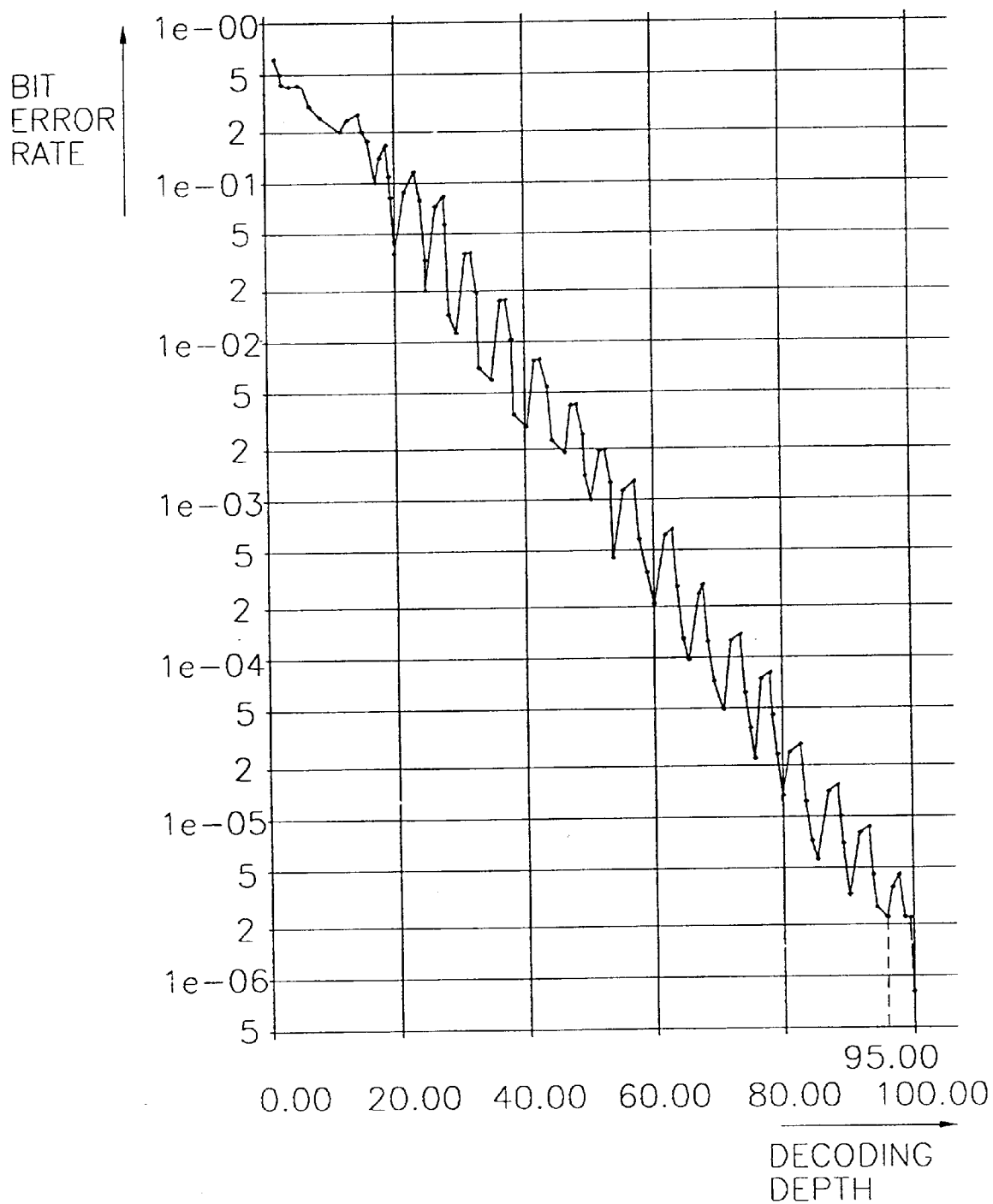
FIG. 4 is a graph illustrating variations of bit error rates according to decoding depths.

FIG. 4 shows a graph simulating a variation of a bit error rate with respect to a decoding depth when the code rate of code punctured under the real channel environment is ⅚. It has been known that the bit error rate decreases as the decoding depth increases for a non-punctured basic code rate ½. However, the bit error rate for the punctured code, as shown in FIG. 4, varies periodically according to the decoding depth, and the varied period corresponds to a numerator of the code rate, 5. For example, referring to the period of the decoding depth of 95 to 99, the bit error rate is the lowest when the decoding depth is 95, whereas the bit error rate is the highest when the decoding depth is 97. Namely, though the trace back is performed twice, a reliability of the decoded symbol is decreased. A result of the simulation for code rates of various puncturing modes shows that the bit error rate according to the decoding depth decreases periodically according numerators of each code rate.

Further, as shown in FIG. 4, determining the decoding depth of the least bit error rate within an arbitrary period with respect to the variation of the periodical bit error rate, and selecting a decoded symbol obtained after progressing the trace back as much as decoding depth of the least bit error rate, brings a better result than increasing the number of the decoding depth during the trace back. Namely, the present invention does not increases the decoding depth according to the code rate, but it determines the decoding depth of the least bit error rate within a range of constant decoding depth according to each code rate of the punctured codes, and selects a symbol traced back to the determined decoding depth as the final decoded symbol.

Accordingly, the Viterbi decoder of the present invention recovers the original information without the need to expand the conventional survivor memory for processing the trace back in the system using the puncturing technique.

Figure 5:
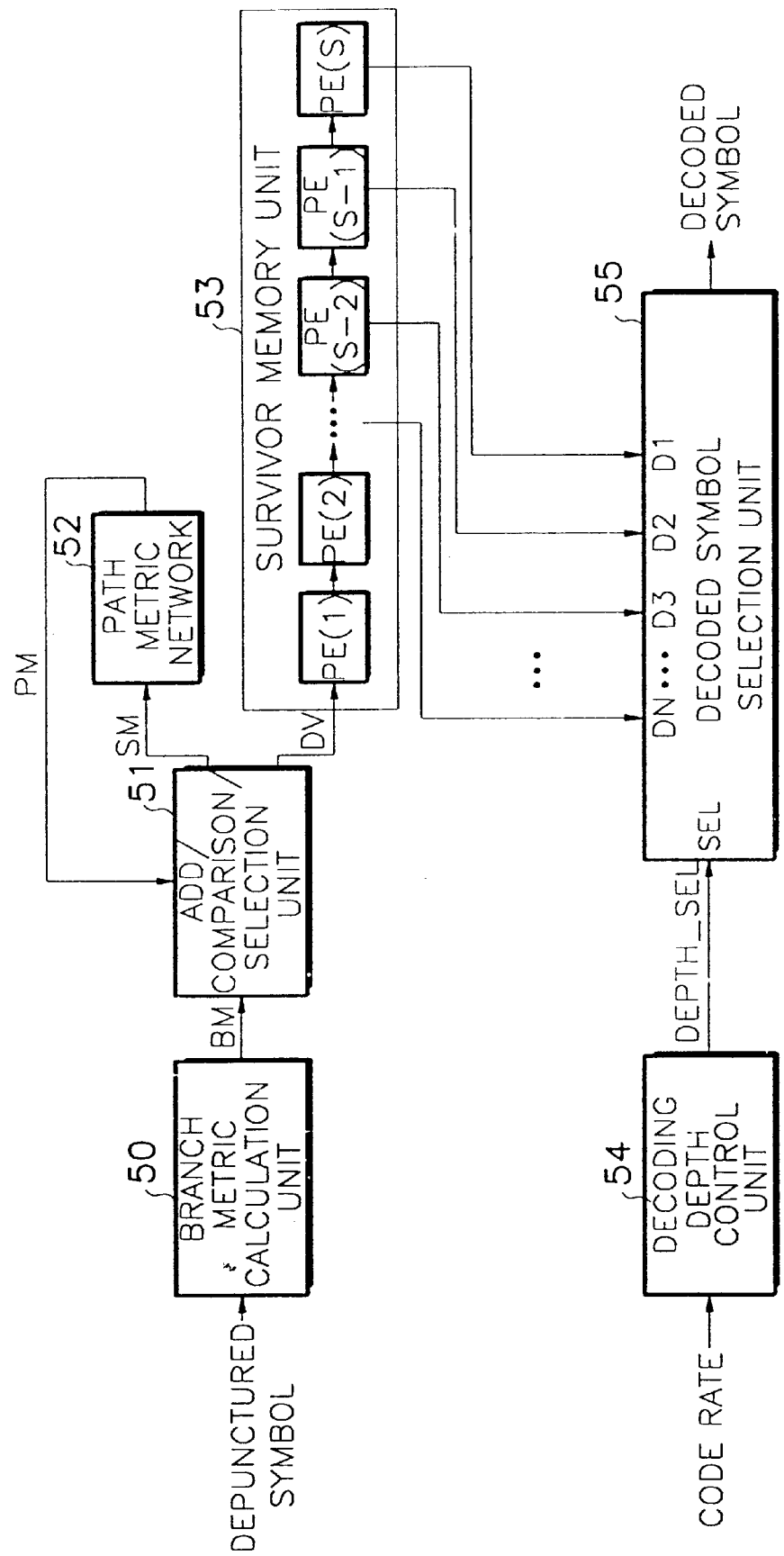
FIG. 5 is a block diagram illustrating a Viterbi decoder according to the present invention.

As shown in FIG. 5, the Viterbi decoder of the present invention comprises a branch metric calculation unit 50, an add/ comparison/ selection unit 51, a path metric network 52, a survivor memory unit 53, a decoding depth control unit 54, and a decoded symbol selection unit 55.

Now, the functions and effects of the Viterbi decoder of the present invention will be described more in detail.

Here, the convolution encoder at the transmitting end has the code rate ½ and the Viterbi decoder at the receiving end receives depunctured symbols whose codes, before depuncturing, are coded in various puncturing patterns with the code rates ⅔, ¾, ⅚, ⅞, etc. The receiving end depunctures the punctured codes of the code rates other than the code rate ½, corresponding to each puncturing pattern, and supplies the depunctured symbols to the Viterbi decoder of the code rate ½.

The branch metric calculation unit 50 receives symbols depunctured according to puncturing patterns of each code rate, calculates branch metrics BM at each branch, and outputs the branch metrics BM to the add/ comparison/ selection unit 51.

The add/ comparison/ selection unit 51 receives the branch metrics BM from the branch metric calculation unit 50 and the previous path metrics PM from the path metric network 52 to update the survivor metric SM, and outputs a decision vector DV corresponding to the survivor metric SM.

The path metric network 52 receives the survivor path metric SM from the add/ comparison/ selection unit 51, delays it as much as a predetermined clock. The delayed survivor path metric SM becomes the previous path metric PM for the next symbol, and it is provided to the add/ comparison/ selection unit 51.

The survivor memory unit 53 outputs a decoded symbol after tracing back to the predetermined decoding depth by using the decision vector DV from the add/ comparison/ selection/ unit 51. The survivor memory unit 53 has a pipeline structure cascaded with processing elements PE(1) to PE(S) (S is the number of processing elements). Each processing element PE(i) (i is an integer of 1 to S) performs n steps of the trace back (n≧1 and n is an integer) during one decoding cycle. A first processing element PE(1) traces back as much as n steps from current arbitrary state by using the decision vector DV from the add/ comparison/ selection unit 51 to obtain the state prior to n steps, and outputs a decision vector DV of the obtained state to a second processing element PE(2). The rest of the processing elements performs the procedure described for the first processing element. Here, the decision vector DV from the ilh processing element is the decoded symbol obtained after tracing back to the decoding depth of n×1 steps. In the preferred embodiment of the present invention, the survivor memory unit 53 has a pipeline structure cascaded with 99 processing elements PE(1) to PE(99), and each processing element performs the trace back of one step.

The decoding depth control unit 54 receives the code rates of the punctured codes, determines the decoding depth of the least bit error rate according to each code rate, and outputs a decoding depth control signal DEPTH_SEL. Here, the code rates of the punctured codes is provided from a Viterbi synchronizing circuit (not shown). The Viterbi synchronizing circuit determines manually or automatically the code rates of the currently received punctured codes and provides the calculated code rates to the each circuit. The desirable decoding depths of the least bit error rate determined through the simulation are indicated in the following table 1.

TABLE 1

Decoding depth of the least bit error rate according to the code rate.

| code rate (R) | decoding depth |
| --- | --- |
| ½ | the S-1$_{th}$ processing element (98) |
| ⅔ | 2n + 1 (=97) |
| ¾ | 3n + 1 (=97) |
| ⅚ | 5n (=95) |
| ⅞ | 7n + 1 (=97) |

As shown in Table 1, for the non-punctured code rate ½, it is desirable to select the bit outputted from the 98th processing element of maximum decoding depth as a final bit for the decoded symbol. The rest punctured code rates ⅔, ¾, ⅚, and ⅞, have minimum values in the period corresponding to integer times or integer+1 times of the code rate's numerator according to their puncturing patterns, respectively. Accordingly, it is desirable to determine the maximum decoding depth value corresponding to integer times or integer+1 times of the code rate's numerator within the range of the decoding depth to 99.

The decoded symbol selection unit 55 receives, selects, and outputs symbols $D_1$, $D_2$, ... and $D_N$ outputted from the predetermined processing elements of processing elements PE(1) to PE(99) in the survivor memory unit 53. The above processing elements trace back to the decoding depth of the least bit error rate at each code rate according to the decoding depth control signal DEPTH_SEL from the decoding depth control unit 54. The decoded symbol selection unit 55 selects the decoded symbols from the 99th, 98th, and 96th processing elements of the survivor memory unit 53. Namely, when the code rate is ⅔, the decoding depth is determined as 97, and the symbol outputted from the 98th processing element from the survivor memory unit 53 is the final decoded symbol. In addition, when the code rate is ⅚, the decoding depth is determined as 95, and the symbol outputted from the 96th processing element from the survivor memory unit 53 is the final decoded symbol. The decoded symbol selection unit 55 selects one of the decision vectors DV outputted from 5 processing elements of the survivor memory unit 53 to evaluate each possible corresponding code rates ½, ⅔, ..., and ¹⁶/₁₇ of the punctured codes. The number of processing elements can be varied.

As described above, since the Viterbi decoder of the present invention provides a system for selecting a decoded symbol from the decoding depth having the least bit error rate corresponding to each punctured code rate, the conventional survivor memory can be used without the need to increase its memory.

While this invention has been described in connection with what is presently considered to be the most practical and preferred embodiments, it is to be understood that the invention is not limited to the disclosed embodiment but, on the contrary, it is intended to cover various modifications and equivalent arrangements included within the spirit and scope of the appended claims.

What is claimed is:

1. A Viterbi decoder for decoding depunctured codes, comprising:

a survivor memory unit for tracing back a current survivor path to a predetermined decoding depth by using metrics at each branch metric after receiving a decision vector generated from a previous survivor path metric and a symbol depunctured according to puncturing patterns, and outputting a multitude of decoded symbols;

a decoding depth control unit for determining a decoding depth of the least bit error rate according to a code rate of the punctured code, and outputting a decoding depth control signal corresponding to a determined decoding depth; and a decoded symbol selection unit for selecting a symbol traced back to the decoding depth corresponding to the decoding depth control signal among a multitude of decoded symbols obtained after tracing back to a predetermined decoding depth in a survivor memory unit, and outputting a final decoded symbol of depunctured code with corresponding code rate.

2. The Viterbi decoder of claim 1, wherein the decoding depth determined by said decoding depth control unit is a maximum value corresponding to integer times of each code rate's numerators of the punctured codes within the predetermined range determined by said survivor memory unit.

3. The Viterbi decoder of claim 1, wherein the decoding depth determined by said decoding depth control unit is a maximum value corresponding to integer+1 times of each code rate's numerators of the punctured codes within the predetermined range determined by said survivor memory unit.

4. A Viterbi decoder for decoding depunctured codes, comprising:

a branch metric calculation unit for calculating and outputting branch metrics at each branch corresponding to symbols depunctured according to puncturing patterns;

an add/ comparison/ selection unit for receiving and comparing the branch metrics from said branch metric calculation unit with fed back previous path metrics, calculating an updated survivor path metric, and outputting a decision vector corresponding to the updated survivor metric;

a path metric network for receiving and storing the survivor path metric from said add/ comparison/ selection unit, the survivor path metric becoming a previous path metric for a next symbol to be provided to said add/ comparison/ selection unit;

a survivor memory unit for tracing back a current survivor path to a predetermined decoding depth by using the decision vector and outputting a multitude of decoded symbols;

a decoding depth control unit for outputting decoding depth control signals corresponding to each decoding depth having the least bit error rate according to each code rate of the punctured codes; and a decoded symbol selection unit for selecting a symbol corresponding to the decoding depth control signal, among a multitude of decoded symbols obtained after tracing back to the predetermined decoding depth from said survivor memory unit, outputting it as a final decoded symbol for the depunctured code having the corresponding code rate.

5. The Viterbi decoder of claim 4, wherein the decoding depth determined by said decoding depth control unit is a maximum value corresponding to integer times of each code rate's numerators of the punctured codes within the predetermined range determined by said survivor memory unit.

6. The Viterbi decoder of claim 4, wherein the decoding depth determined by said decoding depth control unit is a maximum value corresponding to integer+1 times of each code rate's numerators of the punctured codes within the predetermined range determined by said survivor memory unit.

* * * * *